US012772627B2

(12) United States Patent
Inazu et al.

(10) Patent No.: US 12,772,627 B2
(45) Date of Patent: Oct. 20, 2026

(54) SEMICONDUCTOR LIGHT-EMITTING ELEMENT AND METHOD OF MANUFACTURING SEMICONDUCTOR LIGHT-EMITTING ELEMENT

(71) Applicant: NIKKISO CO., LTD., Tokyo (JP)

(72) Inventors: Tetsuhiko Inazu, Ishikawa (JP); Noritaka Niwa, Ishikawa (JP)

(73) Assignee: Hangzhou HFC Semiconductor Co., Hangzhou (CN)

( * ) Notice: Subject to any disclaimer, the term of this patent is extended or adjusted under 35 U.S.C. 154(b) by 356 days.

(21) Appl. No.: 18/627,198

(22) Filed: Apr. 4, 2024

(65) Prior Publication Data

US 2024/0339571 A1 Oct. 10, 2024

(30) Foreign Application Priority Data

Apr. 4, 2023 (JP) ................................ 2023-060795

(51) Int. Cl.
*H10H 20/854* (2025.01)
*H10H 20/01* (2025.01)
*H10H 20/81* (2025.01)

(52) U.S. Cl.
CPC .... *H10H 20/854* (2025.01); *H10H 20/01335* (2025.01); *H10H 20/81* (2025.01); *H10H 20/032* (2025.01); *H10H 20/0362* (2025.01)

(58) Field of Classification Search
None
See application file for complete search history.

(56) References Cited

U.S. PATENT DOCUMENTS 10,971,650 B2 * 4/2021 Kuo .................... H10H 20/814
2022/0246799 A1 * 8/2022 Chen ................. H10H 20/8312

FOREIGN PATENT DOCUMENTS

JP 2020113741 A 7/2020

* cited by examiner

*Primary Examiner* — Bo B Jang
(74) *Attorney, Agent, or Firm* — MUNCY, GEISSLER, OLDS & LOWE, P.C.

(57) ABSTRACT

A semiconductor light-emitting element includes: a substrate having a first thickness; a base layer having a second thickness smaller than the first thickness; an n-type semiconductor layer provided in an inner region different from an outer circumferential region on the base layer; a p-type semiconductor layer; n-side and p-side electrodes; a first protective layer covering the n-side and p-side electrodes, the n-type semiconductor layer, and the p-type semiconductor layer, the first protective layer being in contact with the base layer in the outer circumferential region and having a third thickness smaller than the second thickness in the outer circumferential region; a second protective layer covering the first protective layer, the second protective layer being in contact with the first protective layer in the outer circumferential region and having a fourth thickness smaller than the third thickness in the outer circumferential region.

5 Claims, 11 Drawing Sheets

SEMICONDUCTOR LIGHT-EMITTING ELEMENT AND METHOD OF MANUFACTURING SEMICONDUCTOR LIGHT-EMITTING ELEMENT

RELATED APPLICATION

Priority is claimed to Japanese Patent Application No. 2023-060795, filed on Apr. 4, 2023, the entire content of which is incorporated herein by reference.

BACKGROUND

1. Field of the Invention

The present invention relates to a semiconductor light-emitting element and a method of manufacturing a semiconductor light-emitting element.

2. Description of the Related Art

A semiconductor light-emitting element includes an n-type semiconductor layer, an active layer, and a p-type semiconductor layer stacked on a substrate. An n-side electrode is provided on the n-type semiconductor layer, and a p-side electrode is provided on the p-type semiconductor layer. A covering layer made of a dielectric material such as $SiO_2$, $Al_2O_3$, and SiN is provided on the surface of the semiconductor light-emitting element (see, for example, JP2020-113741).

In order to further improve the reliability of a semiconductor light-emitting element, it is preferred to provide a protective layer having more excellent moisture resistance.

SUMMARY

The present disclosure addresses the issue described above, and a purpose thereof is to provide a technology for improving the reliability of a semiconductor light-emitting element.

A semiconductor light-emitting element according to an embodiment of the present disclosure includes: a substrate having a first thickness; a base layer provided on the substrate and having a second thickness smaller than the first thickness; an n-type semiconductor layer provided in an inner region different from an outer circumferential region on the base layer and having a first upper surface and a second upper surface; an active layer provided on the first upper surface of the n-type semiconductor layer; a p-type semiconductor layer provided on the active layer; an n-side electrode provided on the second upper surface of the n-type semiconductor layer; a p-side electrode provided on the p-type semiconductor layer; a first protective layer having a first n-side opening provided on the n-side electrode and a first p-side opening provided on the p-side electrode, the first protective layer covering the n-side electrode in a portion different from that of the first n-side opening and covering the p-side electrode in a portion different from that of the first p-side opening, the first protective layer covering the n-type semiconductor layer, the active layer, and the p-type semiconductor layer, the first protective layer being in contact with the base layer in the outer circumferential region, the first protective layer being made of an oxide dielectric material, and the first protective layer having a third thickness smaller than the second thickness in the outer circumferential region; a second protective layer having a second n-side opening provided on the n-side electrode and a second p-side opening provided on the p-side electrode, the second protective layer covering the first protective layer in a portion different from portions of the second n-side opening and the second p-side opening, the second protective layer being in contact with the first protective layer in the outer circumferential region, the second protective layer being made of an oxide dielectric material, and the second protective layer having a fourth thickness smaller than the third thickness in the outer circumferential region; an n-side pad electrode connected to the n-side electrode in the second n-side opening; and a p-side pad electrode connected to the p-side electrode in the second p-side opening.

Another embodiment of the present disclosure relates to a method of manufacturing a semiconductor light-emitting element. The method includes: forming, on a substrate having a first thickness, a base layer having a second thickness smaller than the first thickness; forming an n-type semiconductor layer, an active layer, and a p-type semiconductor layer sequentially on the base layer; removing the active layer and the p-side semiconductor layer in a partial region to expose an upper surface of the n-type semiconductor layer; forming an n-side electrode on the upper surface of the n-type semiconductor layer; forming a p-side electrode on the p-type semiconductor layer; removing the n-type semiconductor layer in an element separation region to expose an upper surface of the base layer; forming a first protective layer covering the n-side electrode, the p-side electrode, the n-type semiconductor layer, the active layer, and the p-type semiconductor layer, the first protective layer being in contact with the upper surface of the base layer in the element separation region, the first protective layer being made of an oxide dielectric material, and the first protective layer having a third thickness smaller than the second thickness; forming a first n-side opening by removing the first protective layer on the n-side electrode; forming a first p-side opening by removing the first protective layer on the p-side electrode; forming a second protective layer covering the first protective layer, covering the n-side electrode in the first n-side opening, and covering the p-side electrode in the first p-side opening, the second protective layer being in contact with the first protective layer in the element separation region, the second protective layer being made of an oxide dielectric material, and the second protective layer having a fourth thickness smaller than the third thickness; forming a second n-side opening by removing the second protective layer on the n-side electrode; forming a second p-side opening by removing the second protective layer on the p-side electrode; forming an n-side pad electrode connected to the n-side electrode in the second n-side opening; forming a p-side pad electrode connected to the p-side electrode in the second p-side opening; forming a reformed part by irradiating the substrate with a laser in the element separation region; and cutting the second protective layer, the first protective layer, the base layer, and the substrate by pressing a blade in the element separation region from above the second protective layer.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which.

DETAILED DESCRIPTION OF THE INVENTION

Figure 1:
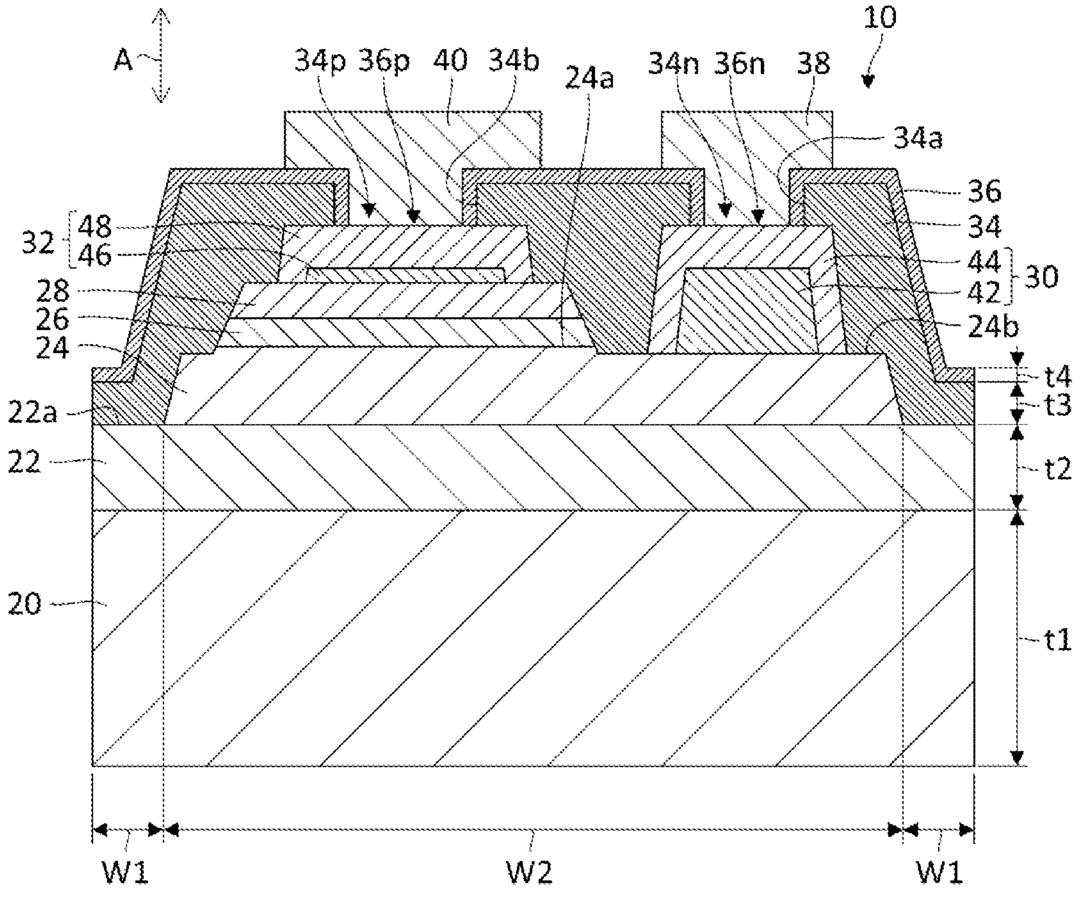
FIG. 1 is a cross-sectional view schematically showing a configuration of a semiconductor light-emitting element according to the embodiment.
Figure 2:
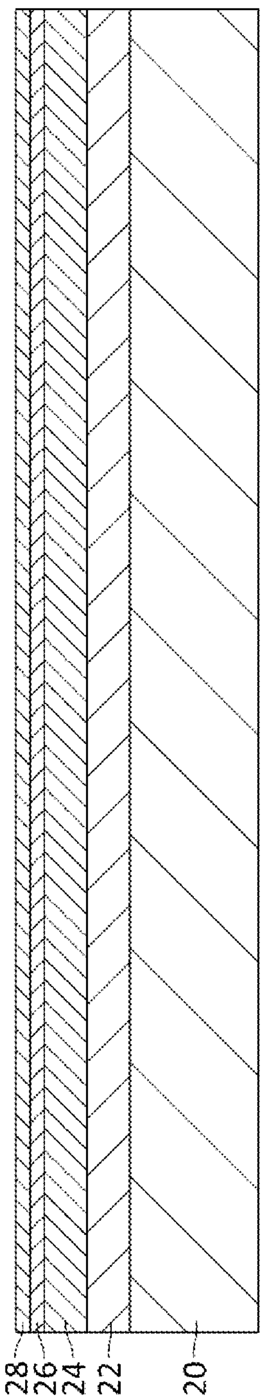
FIG. 2 schematically shows a step of manufacturing the semiconductor light-emitting element according to the embodiment.

The invention will now be described by reference to the preferred embodiments. This does not intend to limit the scope of the present invention, but to exemplify the invention.

A description will be given of an embodiment to practice the present disclosure with reference to the drawings. The same numerals are used in the description to denote the same elements, and a duplicate description is omitted as appropriate. To facilitate the understanding, the relative dimensions of the constituting elements in the drawings do not necessarily mirror the actual relative dimensions in the light-emitting element.

The semiconductor light-emitting element according to the embodiments is configured to emit "deep ultraviolet light" having a central wavelength λ of about 360 nm or shorter and is a so-called deep ultraviolet-light emitting diode (DUV-LED) chip. To output deep ultraviolet light having such a wavelength, an aluminum gallium nitride (AlGaN)-based semiconductor material having a band gap approximately equal to or more than 3.4 eV is used. The embodiments particularly show a case of emitting deep ultraviolet light having a central wavelength λ of about 240 nm-320 nm.

In this specification, the term "AlGaN-based semiconductor material" refers to a semiconductor material containing at least aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0<x+y\leq1$, $0<x<1$, $0<y<1$). The AlGaN-based semiconductor material shall encompass AlGaN or InAlGaN. The "AlGaN-based semiconductor material" in this specification has a molar fraction of AlN and a molar fraction of GaN equal to or more than 18, and, preferably, equal to or more than 5%, equal to or more than 10%, or equal to or more than 20%.

Those materials that do not contain AlN may be distinguished by referring to them as "GaN-based semiconductor materials". "GaN-based semiconductor materials" encompass GaN and InGaN. Similarly, those materials that do not contain GaN may be distinguished by referring to them as "AlN-based semiconductor materials". "AlN-based semiconductor materials" encompass AlN and InAlN.

FIG. 1 is a cross-sectional view schematically showing a configuration of a semiconductor light-emitting element 10 according to the embodiment. The semiconductor light-emitting element 10 includes a substrate 20, a base layer 22, an n-type semiconductor layer 24, an active layer 26, a p-type semiconductor layer 28, an n-side electrode 30, a p-side electrode 32, a first protective layer 34, a second protective layer 36, an n-side pad electrode 38, and a p-side pad electrode 40.

Referring to FIG. 1, the direction indicated by the arrow A may be referred to as "vertical direction" or "direction of thickness". Further, the direction away from the substrate 20 may be defined as "upward", and the direction toward the substrate 20 may be defined as "downward".

The substrate 20 is made of a material having translucency for the ultraviolet light emitted by the semiconductor light-emitting element 10. The substrate 20 is made of an oxide dielectric material and is made of, for example, sapphire ($Al_2O_3$). A first thickness t1 of the substrate is equal to or more than 50 μm and is, for example, equal to or more than 100 μm and equal to or less than 500 μm.

The base layer 22 is provided on the substrate 20. The base layer 22 is made of a nitride material. The base layer 22 is, for example, made of undoped AlN and is, for example, an AlN (HT-AlN; High Temperature AlN) layer gown at a high temperature. A second thickness t2 of the base layer 22 is smaller than the first thickness t1 and is, for example, equal to or smaller than half the first thickness t1. The second thickness t2 is equal to or more than 1 μm and equal to or less than 3 μm and is, for example, equal to or more than 1.5 μm and equal to or less than 2.5 μm. For example, the second thickness t2 is about 2 μm.

The n-type semiconductor layer 24 is provided on the base layer 22. The n-type semiconductor layer 24 is provided in an inner region W2 outside an outer circumferential region W1 on the base layer 22. The n-type semiconductor layer 24 is made of an n-type AlGaN-based semiconductor material. For example, the n-type semiconductor layer 24 is doped with Si as an n-type impurity. The n-type semiconductor layer 24 is, for example, an n-type AlGaN layer. The AlN molar fraction of the n-type semiconductor layer 24 is equal to or more than 25%, equal to or more than 40%, equal to or more than 50%, or equal to or more than 60%. The AlN molar fraction of the n-type semiconductor layer 24 is equal to or less than 80% or equal to or less than 70%. The thickness of the n-type semiconductor layer 24 is equal to or more than 1 μm and equal to or less than 3 μm and is, for example, equal to or more than 1.5 μm and equal to or less than 2.5 μm. For example, the thickness of the n-type semiconductor layer 24 is about 2 μm. The n-type semiconductor layer 24 includes a first upper surface 24*a* and a second upper surface 24*b*.

The active layer 26 is provided on the first upper surface 24*a* of the n-type semiconductor layer 24. The active layer 26 is made of an AlGaN-based semiconductor material and has a double heterojunction structure by being sandwiched between the n-type semiconductor layer 24 and the p-type semiconductor layer 28. For example, the active layer 26 has a monolayer or multilayer quantum well structure and is comprised of a barrier layer made of an undoped AlGaN-based semiconductor material and a well layer made of an undoped AlGaN-based semiconductor material. The active layer 26 includes, for example, a first barrier layer in contact with the n-type semiconductor layer 24 and a first well layer provided on the first barrier layer. One or more pairs of the barrier layer and the well layer may be additionally provided between the first well layer and the p-type semiconductor layer 28. Each of the barrier layer and the well layer has a thickness equal to or more than 1 nm and equal to or less than 20 nm, and has, for example, a thickness equal to or more than 2 nm and equal to or less than 10 nm.

An electron blocking layer may further be provided between the active layer 26 and the p-type semiconductor layer 28. The electron blocking layer is made of an undoped or p-type AlGaN-based semiconductor material. The AlN molar fraction of the electron blocking layer is equal to or more than 40%, equal to or more than 50%, equal to or more than 60%, equal to or more than 70%, or equal to or more than 80%. The electron blocking layer may be an AlN layer. The thickness of the electron blocking layer is equal to or more than 1 nm and equal to or less than 10 nm and is, for example, equal to or more than 2 nm and equal to or less than 5 nm.

The p-type semiconductor layer 28 is formed on the active layer 26. The p-type semiconductor layer 28 is a p-type AlGaN-based semiconductor material layer or a p-type GaN-based semiconductor material layer. For example, the p-type semiconductor layer 28 is an AlGaN layer or a GaN layer doped with magnesium (Mg) as a p-type impurity. The p-type semiconductor layer 28 has, for example, a thickness equal to or more than 20 nm and equal to or less than 400 nm.

The p-type semiconductor layer 28 may be comprised of a plurality of layers. The p-type semiconductor layer 28 may include, for example, a p-type clad layer and a p-type contact layer. The p-type clad layer is in contact with the active layer 26 or the electron blocking layer. The AlN molar ratio of the p-type clad layer is equal to or more than 25% and is, for example, equal to or more than 40%, equal to or more than 50%, equal to or more than 60%, equal to or more than 70%, or equal to or more than 80%. The thickness of the p-type clad layer is equal to or more than 10 nm and equal to or less than 100 nm and is, for example, equal to or more than 15 nm and equal to or less than 70 nm. The p-type contact layer is in contact with the p-side electrode 32. The AlN molar ratio of the p-type contact layer is equal to or less than 20% and is, for example, equal to or less than 10%, equal to or less than 5%, or 0%. The thickness of the p-type contact layer is equal to or more than 5 nm and equal to or less than 30 nm and is, for example, equal to or more than 10 nm and equal to or less than 20 nm.

The n-side electrode 30 is provided on the second upper surface **24*b* of the n-type semiconductor layer 24. The n-side electrode 30 includes an n-side contact electrode 42 and an n-side current diffusion layer 44. The n-side contact electrode 42 has, for example, a Ti/Al/Ti/TiN stack structure. The n-side current diffusion layer 44 covers the upper surface and the side surface of the n-side contact electrode 42. The n-side current diffusion layer 44 has, for example, a Ti/TiN/Ti/Rh/TiN/Ti/Au stack structure in which a Ti layer, a first TiN layer, a Ti layer, an Rh layer, a second TiN layer, a Ti layer, and an Au layer are sequentially stacked. The n-side current diffusion layer 44** may include a plurality of Ti layers and a plurality of Rh layers that are alternately stacked between the first TiN layer and the second TiN layer.

The p-side electrode 32 is provided on the p-type semiconductor layer 28. The p-type semiconductor layer 28 includes a p-side contact electrode and a p-side current diffusion layer 48. The p-side contact electrode 46 may, for example, include an Rh layer. The p-side contact electrode 46 may be comprised only of the Rh layer. The p-side contact electrode 46 may be made of a transparent conductive oxide (TCO) such as tin oxide ($SnO_2$), zinc oxide (ZnO), and indium tin oxide (ITO). The p-side contact electrode 46 may have a Ni/Au stack structure. The p-side current diffusion layer 48 covers the upper surface and the side surface of the p-side contact electrode 46. The p-side current diffusion layer 48 has, for example, a Ti/TiN/Ti/Rh/TiN/Ti/Au stack structure in which a Ti layer, a first TiN layer, a Ti layer, an Rh layer, a second TiN layer, a Ti layer, and an Au layer are sequentially stacked. The p-side current diffusion layer 48 may include a plurality of Ti layers and a plurality of Rh layers that are alternately stacked between the first TiN layer and the second TiN layer.

The first protective layer 34 is provided to cover the entirety of the element from above. The first protective layer 34 covers the n-type semiconductor layer 24, the active layer 26, the p-type semiconductor layer 28, the n-side electrode 30, and the p-side electrode 32. The first protective layer 34 is in contact with an upper surface **22*a* of the base layer 22 in the outer circumferential region W1 and covers the upper surface 22*a* of the base layer 22. The first protective layer 34 covers, for example, the entirety of the upper surface 22*a* of the base layer 22 in the outer circumferential region W1. The first protective layer 34 has a first n-side opening 34*n* provided on the n-side electrode 30 and a first p-side opening 34*p* provided on the p-side electrode 32. The first protective layer 34 covers the n-side electrode 30 in a portion different from that of the first n-side opening 34*n* and covers the p-side electrode 32 in a portion different from that of the first p-side opening 34*p*. The first protective layer 34 is made of an oxide dielectric material such as silicon oxide ($SiO_2$), aluminum oxide ($Al_2O_3$), and hafnium oxide ($HfO_2$). The first protective layer 34 is preferably made of $SiO_2$. A third thickness t3 of the first protective layer 34 is smaller than the second thickness t2 and is, for example, equal to or smaller than half the second thickness t2. The third thickness t3** is equal to or more than 0.5 μm and equal to or less than 1.5 μm and is, for example, equal to or more than 0.7 μm and equal to or less than 1.2 μm and is, for example, equal to or more than 0.8 μm and equal to or less than 1 μm.

The second protective layer 36 is provided to cover the entirety of the element from above. The second protective layer 36 is provided to cover the entirety of the surface of the first protective layer 34. The second protective layer 36 has a second n-side opening **36*n* provided on the n-side electrode 30 and a second p-side opening 36*p* provided on the p-side electrode 32. The second protective layer 36 covers the first protective layer 34 in a portion different from portions of the second n-side opening 36*n* and the second p-side opening 36*p*. The second protective layer 36 covers an inner circumferential surface 34*a* of the first protective layer 34 that defines the first n-side opening 34*n*. The second protective layer 36 covers an inner circumferential surface 34*b* of the first protective layer 34 that defines the first p-side opening 34*p*. The second protective layer 36 is in contact with the first protective layer 34 in the outer circumferential region W1 and overlaps the first protective layer 34. The second protective layer 36 is not in contact with the base layer 22. The second protective layer 36 is made of an oxide dielectric material such as silicon nitride (SiN). A fourth thickness t4 of the second protective layer 36** is smaller than the third thickness t3 and is, for example, equal to or smaller than half the third thickness t3. The fourth thickness t4 is equal to or more than 0.1 μm and equal to or less than 0.4 μm and is, for example, equal to or more than 0.15 μm and equal to or less than 0.3 μm. For example, the fourth thickness t4 is about 0.2 μm.

The n-side pad electrode 38 is connected to the n-side electrode 30 in the second n-side opening 36*n*. The n-side pad electrode 38 is provided to block the second n-side opening 36*n* and is provided to overlap the second protective layer 36. The p-side pad electrode 40 is connected to the p-side electrode 32 in the second p-side opening 36*p*. The p-side pad electrode 40 is provided to block the second p-side opening 36*p* and is provided to overlap the second protective layer 36. The n-side pad electrode 38 and the p-side pad electrode 40 include, for example, a Ni/Au, Ti/Au, or Ti/Pt/Au stack structure. The thickness of each of the n-side pad electrode 38 and the p-side pad electrode 40 is equal to or more than 0.1 μm and is, for example, equal to or more than 0.2 μm and equal to or less than 2 μm.

A description will now be given of a method of manufacturing the semiconductor light-emitting element 10 according to the embodiment. FIGS. 2-11 schematically show steps of manufacturing the semiconductor light-emitting element 10 according to the embodiment. First, referring to FIG. 2, the base layer 22 is formed on the substrate 20. The n-type semiconductor layer 24, the active layer 26, and the p-type semiconductor layer 28 are then formed on the base layer 22 sequentially. The base layer 22, the n-type semiconductor layer 24, the active layer 26, and the p-type semiconductor layer 28 can be formed by a well-known epitaxial growth method such as the metal organic vapor phase epitaxy (MOVPE) method and the molecular beam epitaxy (MBE) method.

Figure 3:
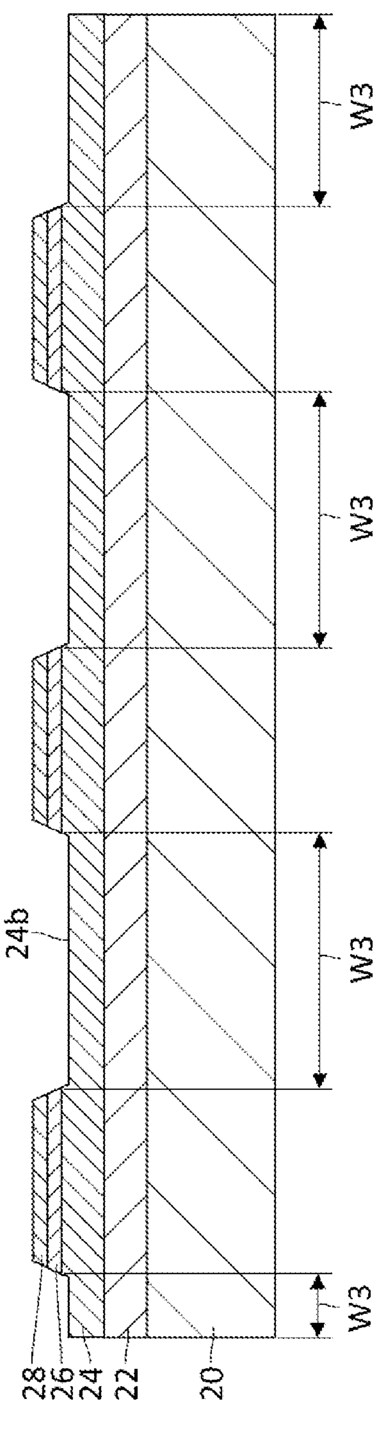
FIG. 3 schematically shows a step of manufacturing the semiconductor light-emitting element according to the embodiment.

Then, as shown in FIG. 3, the p-type semiconductor layer 28 and the active layer 26 are removed by dry-etching or the like in a partial region W3 by using, for example, an etching mask to expose the second upper surface 24*b* of the n-type semiconductor layer 24.

Figure 4:
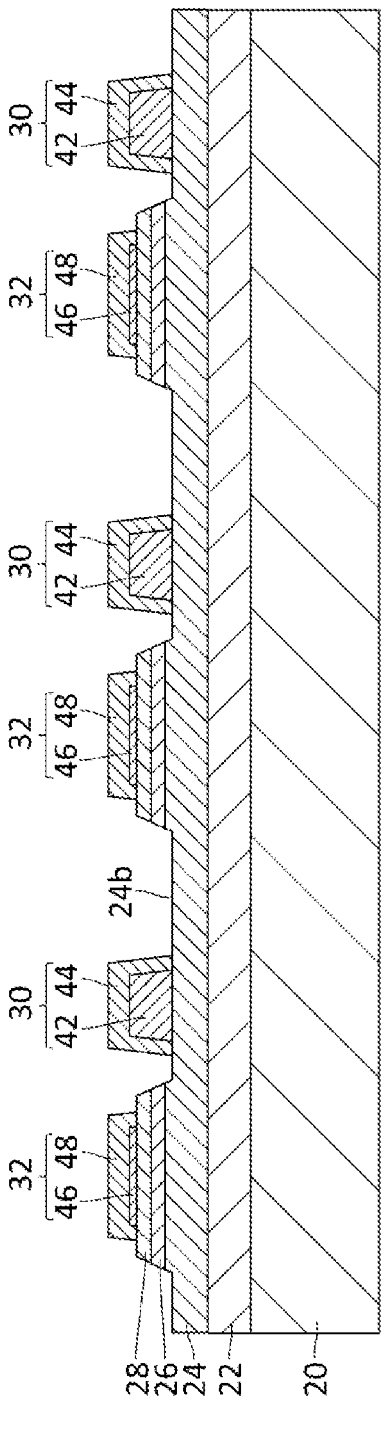
FIG. 4 schematically shows a step of manufacturing the semiconductor light-emitting element according to the embodiment.

Then, as shown in FIG. 4, the n-side electrode 30 and the p-side electrode 32 are formed by using, for example, a lift-off mask. The n-side contact electrode 42 is formed on the second upper surface 24*b* of the n-type semiconductor layer 24, and, after the n-side contact electrode 42 is formed, the n-side contact electrode 42 is annealed. The p-side contact electrode 46 is formed on the upper surface of the p-type semiconductor layer 28, and the p-side contact electrode 46 is annealed. Subsequently, the n-side current diffusion layer 44 that covers the n-side contact electrode 42 is formed, and the p-side current diffusion layer 48 that covers the p-side contact electrode 46 is formed. The n-side electrode 30 and the p-side electrode 32 can be formed by deposition or sputtering.

Figure 5:
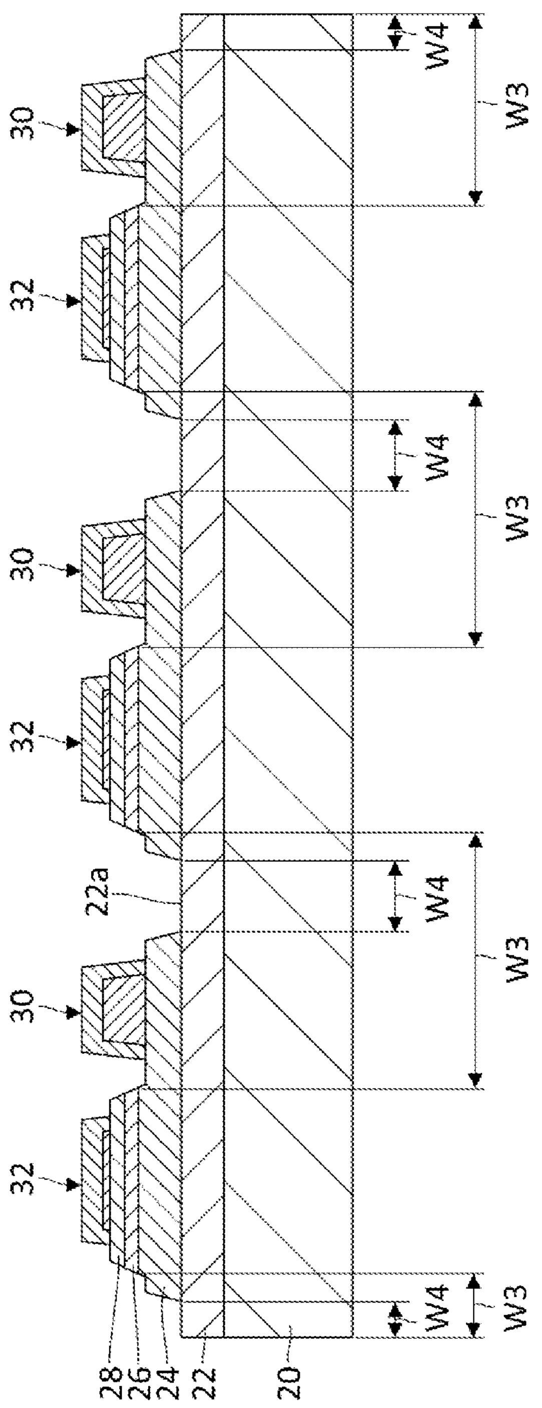
FIG. 5 schematically shows a step of manufacturing the semiconductor light-emitting element according to the embodiment.

Then, as shown in FIG. 5, the n-type semiconductor layer 24 is removed by dry-etching or the like in an element separation region W4 by using, for example, an etching mask to expose the upper surface 22*a* of the base layer 22.

Figure 6:
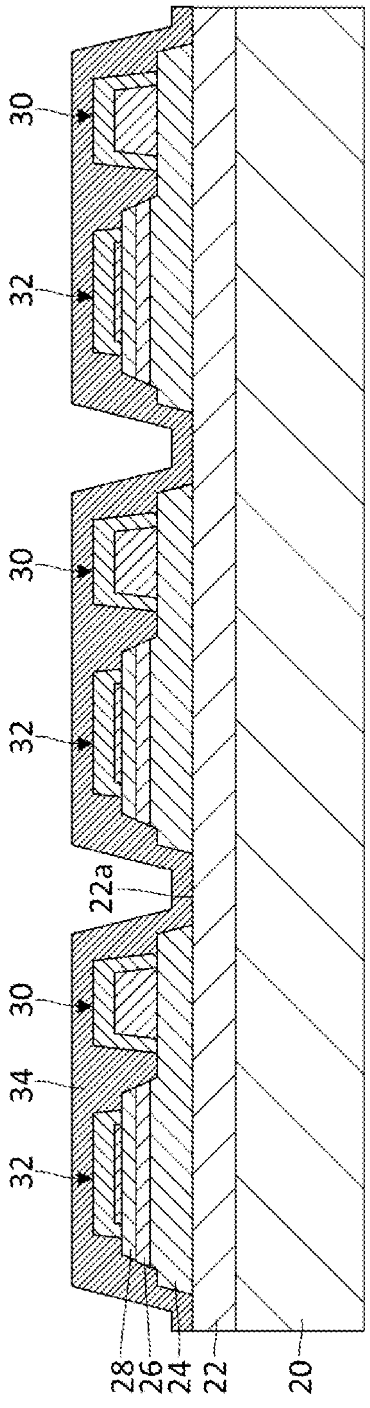
FIG. 6 schematically shows a step of manufacturing the semiconductor light-emitting element according to the embodiment.

Then, as shown in FIG. 6, the first protective layer 34 is formed to cover the entirety of the element from above. The first protective layer 34 can be formed by the plasma enhanced chemical vapor deposition (PECVD) method, atomic layer deposition (ALD) method, sputtering method, etc.

Figure 7:
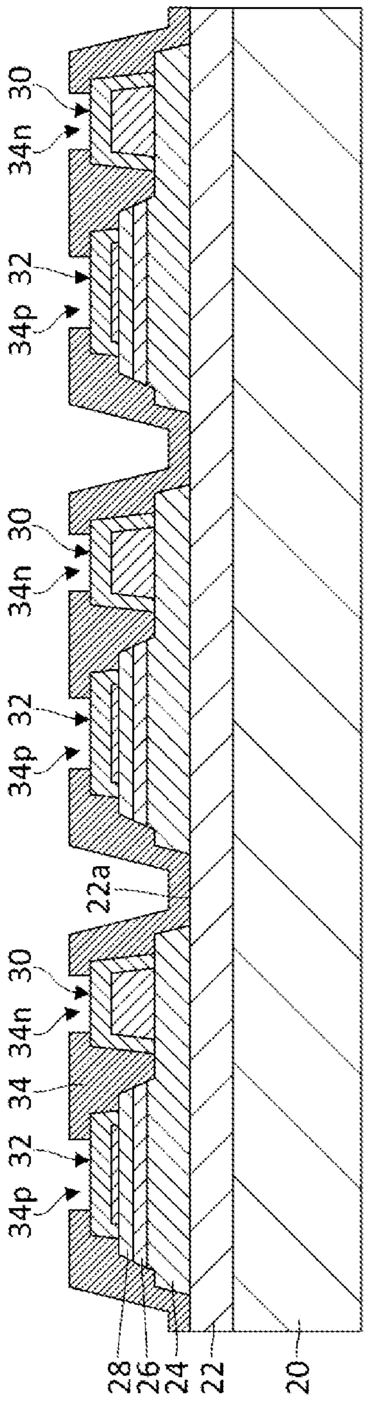
FIG. 7 schematically shows a step of manufacturing the semiconductor light-emitting element according to the embodiment.

Then, as shown in FIG. 7, the first protective layer 34 on the n-side electrode 30 and on the p-side electrode 32 is removed by dry-etching or the like by using, for example, an etching mask to form the first n-side opening 34*n* and the first p-side opening 34*p*.

Figure 8:
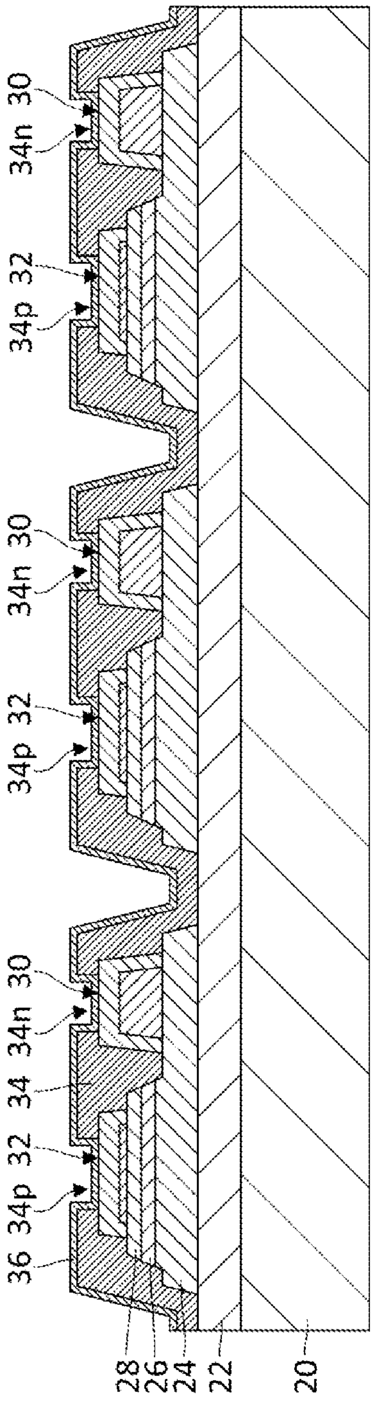
FIG. 8 schematically shows a step of manufacturing the semiconductor light-emitting element according to the embodiment.

Then, as shown in FIG. 8, the second protective layer 36 is formed to cover the entirety of the element from above. The second protective layer 36 can be formed by using the PECVD method, ALD method, sputtering method, etc.

Figure 9:
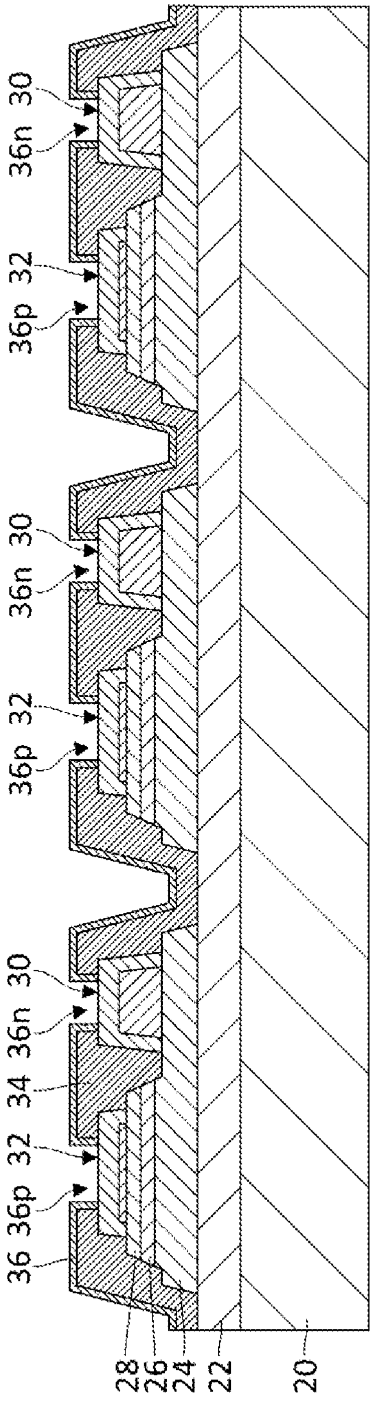
FIG. 9 schematically shows a step of manufacturing the semiconductor light-emitting element according to the embodiment.

Then, as shown in FIG. 9, the second protective layer 36 on the n-side electrode 30 and on the p-side electrode 32 is removed by dry-etching or the like by using, for example, an etching mask to form the second n-side opening 36*n* and the second p-side opening 36*p*.

Figure 10:
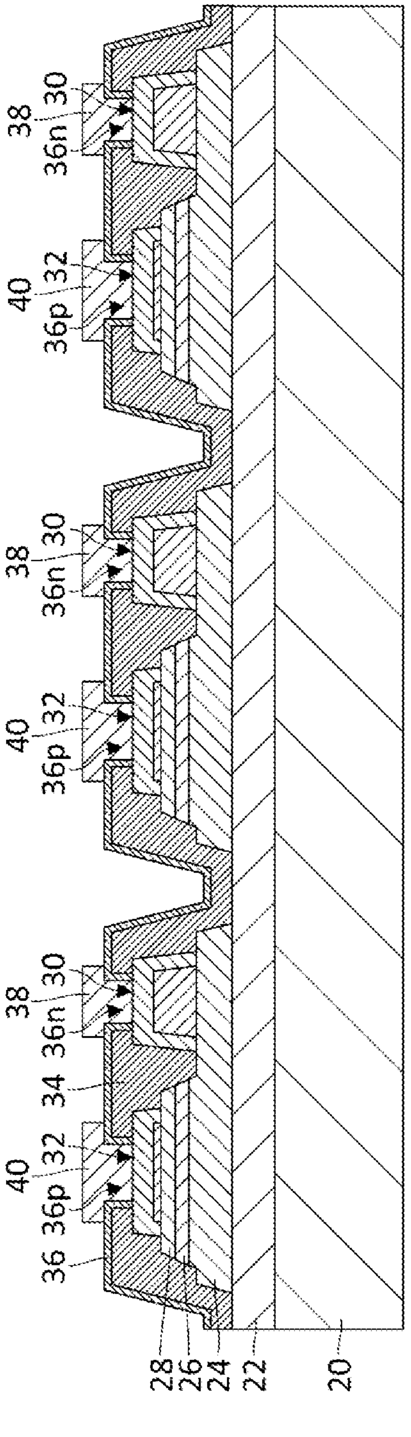
FIG. 10 schematically shows a step of manufacturing the semiconductor light-emitting element according to the embodiment.

Then, as shown in FIG. 10, the n-side pad electrode 38 connected to the n-side electrode 30 in the second n-side opening 36*n* is formed. Further, the p-side pad electrode 40 connected to the p-side electrode 32 in the second p-side opening 36*p* is formed. The n-side pad electrode 38 and the p-side pad electrode 40 can be formed by deposition or sputtering.

Figure 11:
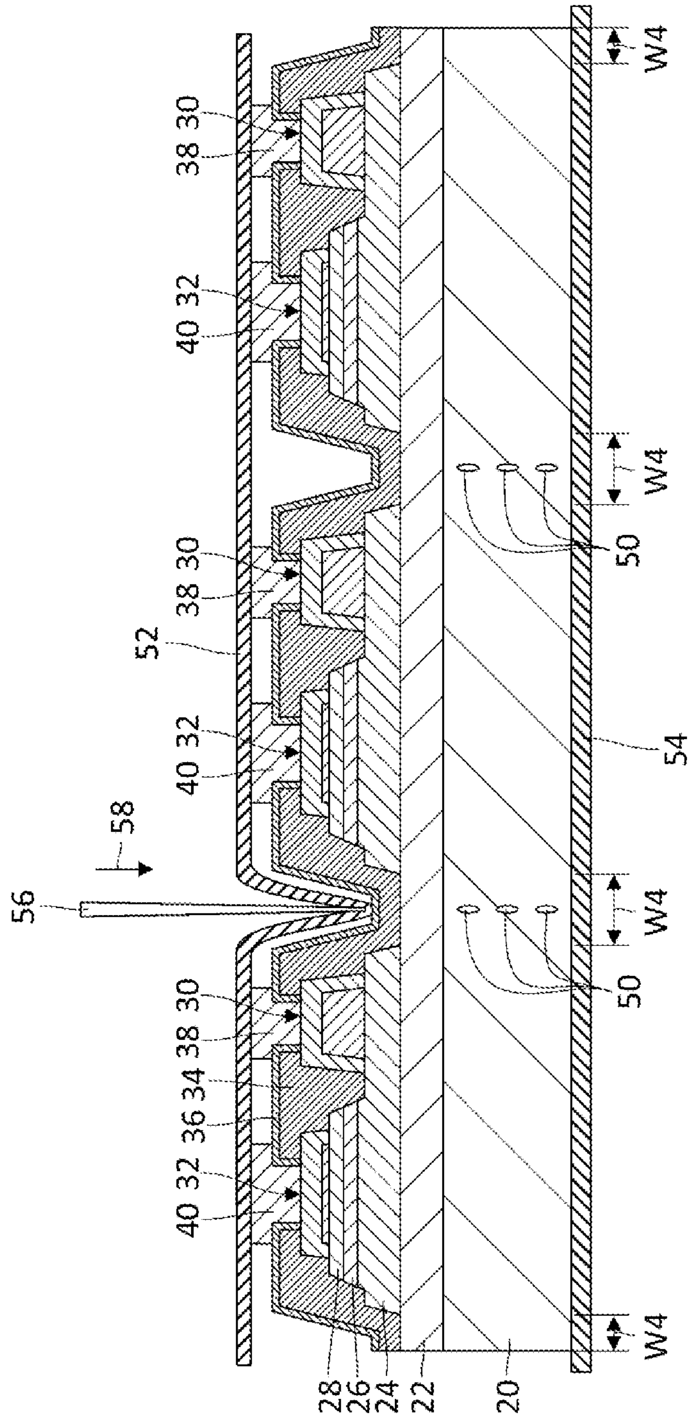
FIG. 11 schematically shows a step of manufacturing the semiconductor light-emitting element according to the embodiment.

Then, as shown in FIG. 11, a reformed part 50 is formed inside the substrate 20 by irradiating the substrate 20 with a laser in the element separation region W4. The reformed part 50 can be formed by, for example, irradiating the substrate 20 with a high-intensity short-pulse laser in a wavelength range that is transparent to the substrate 20. The reformed part 50 may be formed in a plurality of places inside the substrate 20 in the direction of thickness.

Then, as shown in FIG. 11, a first protective sheet 52 in contact with the n-side pad electrode 38 and the p-side pad electrode 40 is provided. The first protective sheet 52 is a resin sheet having adhesiveness and elasticity. Further, a second protective sheet 54 in contact with the substrate 20 is provided. The second protective sheet 54 is a resin sheet that does not have adhesiveness and elasticity. The first protective sheet 52 includes, for example, an elastic layer made of a soft resin such as those based on polyolefin and polyvinyl chloride and an adhesive layer made of a resin pressure-sensitive adhesive such as those based on acryl and silicone. The second protective sheet 54 includes, for example, a resin layer made of a hard resin such as those based on polyolefin and polyester. The thickness of the first protective sheet 52 and the second protective sheet 54 is not particularly limited, but is, for example, equal to or less than 0.2 mm, equal to or less than 0.15 mm, or equal to or less than 0.1 mm. With the first protective sheet 52 and the second protective sheet 54 being provided, a blade 56 is pressed in the direction of thickness as indicated by an arrow 58 from above the first protective sheet 52 toward the element separation region W4. When the blade 56 is pressed, the substrate 20, the base layer 22, the first protective layer 34, and the second protective layer 36 are broken in the element separation region W4, starting at the reformed part 50. This turns the substrate 20 into individual pieces, and the semiconductor light-emitting element 10 shown in FIG. 1 is completed.

According to the embodiment, the outer circumference of the semiconductor light-emitting element 10 is formed by a stack structure of the substrate 20, the base layer 22, the first protective layer 34, and the second protective layer 36 so that the quality of sealing of a light-emitting structure including the n-type semiconductor layer 24, the active layer 26, and the p-type semiconductor layer 28 is increased.

According to the embodiment, a structure in which the substrate 20, the base layer 22, the first protective layer 34, and the second protective layer 36 are sequentially stacked is formed in the outer circumferential region W1 (or the element separation region W4), and the thickness decreases progressively from the substrate 20 toward the second protective layer 36 (that is, t1>t2>t3>t4). This prevents cracks from being created in the cut part in the process of cutting the element separation region W4 to produce individual pieces. In particular, cracks are inhibited from being created more successfully as compared to the case where a layer of small thickness is inserted in the middle of the stack structure in the outer circumferential region W1 (or the element separation region W4). Thereby, a highly reliable sealing structure is formed.

According to the embodiment, cracks are prevented from being created in the cut part by providing the first protective sheet 52 having adhesiveness and elasticity on the n-side pad electrode 38 and the p-side pad electrode 40 and cutting the element separation region W4 by pressing the blade 56 from above the first protective sheet 52. By using the first protective sheet 52 having adhesiveness and elasticity, misalignment of the blade 56 with respect to the element separation region W4 at the time of cutting is prevented. This prevents the blade 56 from being pressed against a place distanced from the element separation region W4 to damage the semiconductor layer or the electrode.

The semiconductor light-emitting element 10 according to the embodiment has excellent moisture resistance and so can be used without being sealed in a package. The semiconductor light-emitting element 10 can be energized for use while the second protective layer 36 is exposed to the external environment. For example, the semiconductor light-emitting element 10 can be used in a chip-on submount (CoS) form.

Given above is a description of the present disclosure based on the embodiment. The present disclosure is not restricted by the embodiment described above, and it will be understood by those skilled in the art that various design changes are possible and various modifications are possible and that such modifications are also within the scope of the present disclosure.

Some aspects of the present disclosure will be described.

The first aspect of the present disclosure relates to a semiconductor light-emitting element including: a substrate having a first thickness; a base layer provided on the substrate and having a second thickness smaller than the first thickness; an n-type semiconductor layer provided in an inner region different from an outer circumferential region on the base layer and having a first upper surface and a second upper surface; an active layer provided on the first upper surface of the n-type semiconductor layer; a p-type semiconductor layer provided on the active layer; an n-side electrode provided on the second upper surface of the n-type semiconductor layer; a p-side electrode provided on the p-type semiconductor layer; a first protective layer having a first n-side opening provided on the n-side electrode and a first p-side opening provided on the p-side electrode, the first protective layer covering the n-side electrode in a portion different from that of the first n-side opening and covering the p-side electrode in a portion different from that of the first p-side opening, the first protective layer covering the n-type semiconductor layer, the active layer, and the p-type semiconductor layer, the first protective layer being in contact with the base layer in the outer circumferential region, the first protective layer being made of an oxide dielectric material, and the first protective layer having a third thickness smaller than the second thickness in the outer circumferential region; a second protective layer having a second n-side opening provided on the n-side electrode and a second p-side opening provided on the p-side electrode, the second protective layer covering the first protective layer in a portion different from portions of the second n-side opening and the second p-side opening, the second protective layer being in contact with the first protective layer in the outer circumferential region, the second protective layer being made of an oxide dielectric material, and the second protective layer having a fourth thickness smaller than the third thickness in the outer circumferential region; an n-side pad electrode connected to the n-side electrode in the second n-side opening; and a p-side pad electrode connected to the p-side electrode in the second p-side opening. According to the first aspect, the thickness of the substrate, the base layer, the first protective layer, and the second protective layer stacked in the outer circumferential region is progressively smaller in the direction of stack. Therefore, it is possible to prevent cracks from being created in the cut part in the process of cutting the outer circumferential region to produce individual pieces of semiconductor light-emitting elements. This improves the reliability of the sealing structure in which the substrate, the base layer, the first protective layer, and the second protective layer are stacked.

The second aspect of the present disclosure relates to the semiconductor light-emitting element according to the first aspect, wherein the second thickness is equal to or smaller than half the first thickness, the third thickness is equal to or smaller than half the second thickness, and the fourth thickness is equal to or smaller than half the third thickness. According to the second aspect, the thickness of the substrate, the base layer, the first protective layer, and the second protective layer stacked in the outer circumferential region is equal to or smaller than half the thickness of the layer below in the direction of stack. Therefore, it is possible to suitably prevent cracks from being created in the cut part in the process of cutting the outer circumferential region to produce individual pieces of semiconductor light-emitting elements. This improves the reliability of the sealing structure in which the substrate, the base layer, the first protective layer, and the second protective layer are stacked.

The third aspect of the present disclosure relates to the semiconductor light-emitting element according to the first or second aspect, wherein the second thickness is equal to or more than 1 μm and equal to or less than 3 μm, the third thickness is equal to or more than 0.5 μm and equal to or less than 1.5 μm, and the third thickness is equal to or more than 0.1 μm and equal to or less than 0.4 μm. According to the third aspect, the reliability of the sealing structure in which the substrate, the base layer, the first protective layer, and the second protective layer are stacked is improved by setting the thickness of the base layer, the first protective layer, and the second protective layer properly.

The fourth aspect of the present disclosure relates to a method of manufacturing a semiconductor light-emitting element, including: forming, on a substrate having a first thickness, a base layer having a second thickness smaller than the first thickness; forming an n-type semiconductor layer, an active layer, and a p-type semiconductor layer sequentially on the base layer; removing the active layer and the p-side semiconductor layer in a partial region to expose an upper surface of the n-type semiconductor layer; forming an n-side electrode on the upper surface of the n-type semiconductor layer; forming a p-side electrode on the p-type semiconductor layer; removing the n-type semiconductor layer in an element separation region to expose an upper surface of the base layer; forming a first protective layer covering the n-side electrode, the p-side electrode, the n-type semiconductor layer, the active layer, and the p-type semiconductor layer, the first protective layer being in contact with the upper surface of the base layer in the element separation region, the first protective layer being made of an oxide dielectric material, and the first protective layer having a third thickness smaller than the second thickness; forming a first n-side opening by removing the first protective layer on the n-side electrode; forming a first p-side opening by removing the first protective layer on the p-side electrode; forming a second protective layer covering the first protective layer, covering the n-side electrode in the first n-side opening, and covering the p-side electrode in the first p-side opening, the second protective layer being in contact with the first protective layer in the element separation region, the second protective layer being made of an oxide dielectric material, and the second protective layer having a fourth thickness smaller than the third thickness; forming a second n-side opening by removing the second protective layer on the n-side electrode; forming a second p-side opening by removing the second protective layer on the p-side electrode; forming an n-side pad electrode connected to the n-side electrode in the second n-side opening; forming a p-side pad electrode connected to the p-side electrode in the second p-side opening; forming a reformed part by irradiating the substrate with a laser in the element separation region; and cutting the second protective layer, the first protective layer, the base layer, and the substrate by pressing a blade in the element separation region from above the second protective layer. According to the fourth aspect, the thickness of the substrate, the base layer, the first protective layer, and the second protective layer stacked in the element separation region is progressively smaller in the direction of stack. Therefore, it is possible to prevent cracks from being created in the cut part in the process of cutting the element separation region to produce individual pieces of semiconductor light-emitting elements. This improves the reliability of the sealing structure in which the substrate, the base layer, the first protective layer, and the second protective layer are stacked.

The fifth aspect of the present disclosure relates to the method of manufacturing a semiconductor light-emitting element according to the fourth aspect, further including: providing a sheet having adhesiveness and elasticity on the n-side pad electrode and the p-side pad electrode, wherein the blade is pressed from above the sheet in the cutting. According to the fifth aspect, it is possible to prevent misalignment of the blade with respect to the element separation region at the time of cutting, by using the sheet having adhesiveness and elasticity. This makes it possible to prevent the blade from being pressed against a place outside the element separation region to damage the semiconductor layer or the electrode.

What is claimed is:

1. A semiconductor light-emitting element comprising:

a substrate having a first thickness;

a base layer provided on the substrate and having a second thickness smaller than the first thickness;

an n-type semiconductor layer provided in an inner region different from an outer circumferential region on the base layer and having a first upper surface and a second upper surface;

an active layer provided on the first upper surface of the n-type semiconductor layer;

a p-type semiconductor layer provided on the active layer;

an n-side electrode provided on the second upper surface of the n-type semiconductor layer;

a p-side electrode provided on the p-type semiconductor layer;

a first protective layer having a first n-side opening provided on the n-side electrode and a first p-side opening provided on the p-side electrode, the first protective layer covering the n-side electrode in a portion different from that of the first n-side opening and covering the p-side electrode in a portion different from that of the first p-side opening, the first protective layer covering the n-type semiconductor layer, the active layer, and the p-type semiconductor layer, the first protective layer being in contact with the base layer in the outer circumferential region, the first protective layer being made of an oxide dielectric material, and the first protective layer having a third thickness smaller than the second thickness in the outer circumferential region;

a second protective layer having a second n-side opening provided on the n-side electrode and a second p-side opening provided on the p-side electrode, the second protective layer covering the first protective layer in a portion different from portions of the second n-side opening and the second p-side opening, the second protective layer being in contact with the first protective layer in the outer circumferential region, the second protective layer being made of an oxide dielectric material, and the second protective layer having a fourth thickness smaller than the third thickness in the outer circumferential region;

an n-side pad electrode connected to the n-side electrode in the second n-side opening; and a p-side pad electrode connected to the p-side electrode in the second p-side opening.

2. The semiconductor light-emitting element according to claim 1, wherein the second thickness is equal to or smaller than half the first thickness, the third thickness is equal to or smaller than half the second thickness, and the fourth thickness is equal to or smaller than half the third thickness.

3. The semiconductor light-emitting element according to claim 1, wherein the second thickness is equal to or more than 1 μm and equal to or less than 3 μm, the third thickness is equal to or more than 0.5 μm and equal to or less than 1.5 μm, and the third thickness is equal to or more than 0.1 μm and equal to or less than 0.4 μm.

4. A method of manufacturing a semiconductor light-emitting element, comprising:

forming, on a substrate having a first thickness, a base layer having a second thickness smaller than the first thickness;

forming an n-type semiconductor layer, an active layer, and a p-type semiconductor layer sequentially on the base layer;

removing the active layer and the p-side semiconductor layer in a partial region to expose an upper surface of the n-type semiconductor layer;

forming an n-side electrode on the upper surface of the n-type semiconductor layer;

forming a p-side electrode on the p-type semiconductor layer;

removing the n-type semiconductor layer in an element separation region to expose an upper surface of the base layer;

forming a first protective layer covering the n-side electrode, the p-side electrode, the n-type semiconductor layer, the active layer, and the p-type semiconductor layer, the first protective layer being in contact with the upper surface of the base layer in the element separation region, the first protective layer being made of an oxide dielectric material, and the first protective layer having a third thickness smaller than the second thickness;

forming a first n-side opening by removing the first protective layer on the n-side electrode;

forming a first p-side opening by removing the first protective layer on the p-side electrode;

forming a second protective layer covering the first protective layer, covering the n-side electrode in the first n-side opening, and covering the p-side electrode in the first p-side opening, the second protective layer being in contact with the first protective layer in the element separation region, the second protective layer being made of an oxide dielectric material, and the second protective layer having a fourth thickness smaller than the third thickness;

forming a second n-side opening by removing the second protective layer on the n-side electrode;

forming a second p-side opening by removing the second protective layer on the p-side electrode;

forming an n-side pad electrode connected to the n-side electrode in the second n-side opening;

forming a p-side pad electrode connected to the p-side electrode in the second p-side opening;

forming a reformed part by irradiating the substrate with a laser in the element separation region; and cutting the second protective layer, the first protective layer, the base layer, and the substrate by pressing a blade in the element separation region from above the second protective layer.

5. The method of manufacturing a semiconductor light-emitting element according to claim 4, further comprising:

providing a sheet having adhesiveness and elasticity on the n-side pad electrode and the p-side pad electrode, wherein the blade is pressed from above the sheet in the cutting.

* * * * *